United States Patent [19]

Falckenberg

[11] 3,816,906

[45] June 18, 1974

[54] METHOD OF DIVIDING MG-AL SPINEL SUBSTRATE WAFERS COATED WITH SEMICONDUCTOR MATERIAL AND PROVIDED WITH SEMICONDUCTOR COMPONENTS

[75] Inventor: Richard Falckenberg, Unterhaching, Germany

[73] Assignee: Siemens Aktiengesellschaft, Munchen, Erlangen, Germany

[22] Filed: Feb. 26, 1973

[21] Appl. No.: 335,739

Related U.S. Application Data

[63] Continuation of Ser. No. 46,247, June 15, 1970, abandoned.

[30] Foreign Application Priority Data

June 20, 1969 Germany ........................... 1931245

[52] U.S. Cl. .................................. 29/583, 148/175

[51] Int. Cl. .............................................. B01j 17/00

[58] Field of Search ............... 29/580, 583; 148/175

[56] References Cited

UNITED STATES PATENTS

| | | | |
|---|---|---|---|
| 3,054,709 | 9/1962 | Freestone | 29/583 |
| 3,332,143 | 7/1967 | Gentry | 29/583 |
| 3,349,475 | 10/1967 | Marinace | 29/583 |
| 3,433,684 | 3/1969 | Zanowick | 148/175 |
| 3,542,266 | 11/1970 | Woelfle | 29/583 |

*Primary Examiner*—W. C. Tupman

*Attorney, Agent, or Firm*—Herbert L. Lerner

[57] ABSTRACT

Process of dividing a plurality of semiconductor components on a Mg-Al spinel substrate, coated with semiconductor material. The process comprises providing the spinel substrate wafer, prior to the production of the individual semiconductor elements, with a marking which indicates the <100> directions, producing the semiconductor elements so that their boundaries are parallel to the marked <100 > directions, scoring and mechanically dividing the entire substrate wafer into individual components along these lines.

3 Claims, 2 Drawing Figures

METHOD OF DIVIDING MG-AL SPINEL SUBSTRATE WAFERS COATED WITH SEMICONDUCTOR MATERIAL AND PROVIDED WITH SEMICONDUCTOR COMPONENTS

This is a continuation, of application Ser. No. 46,247, filed June 15, 1970 and now abandoned.

My invention relates to a method of dividing a plurality of semiconductor components, particularly integrated circuits, on an Mg-Al spinel substrate wafer coated with semiconductor material.

An important factor in the production of semiconductor components and of integrated circuits at the present stage of development is the necessity of directing the technology and construction of the components to mass production.

Integrated circuits may be produced by precipitating silicon layers epitactically upon Mg-Al spinel substrate wafers. The electric circuits are produced in the course of a series of method steps of the planar technique, such as the indiffusion of p- or n-conducting dopants and oxide masks, whereby the density of these circuits may read up to 10,000/cm$^2$. It is necessary to divide the coated spinel substrate wafer, into its individual components, in order to mount the individual components upon bases and to provide them with additional electrical terminals, as well as to eliminate those components which have been made useless by processing errors and mechanical influences. However, the extreme hardness of the spinel substrate wafers makes it very difficult to effect a damage-free division.

The object of my invention is to solve these shortcomings in a very simple method. I achieve this by providing the spinel substrate wafer, prior to the manufacture of the individual semiconductor components, with a marking which indicates the <100> directions. The components are produced so that their boundary lines extend in parallel to the marked <100> directions, whereby the division of the entire substrate wafers into the individual components is effected along these lines, by means of scoring and with the aid of mechanical separation methods.

My invention is based on the observation that spinel crystal wafers, which are mechanically stressed in point form in the center, will break uniformly into four quadrants, the break lines extending straight in <100> direction, regardless on whether the stressing is done perpendicularly to (100) or to (111) planes. The break does not extend parallel to the (III) plane which is described as a cleavage plane in the reference literature (Smakula: MONOCRYSTALS, 1966, page 327).

Figure 1:
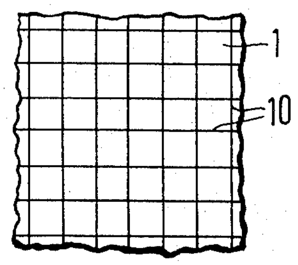
FIG. 1 shows a crystal wafer oriented in the <100> direction.
Figure 2:
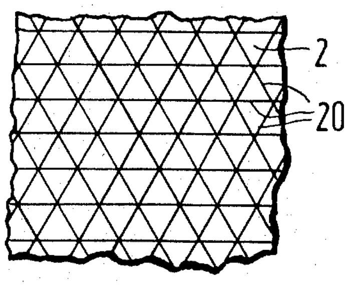
FIG. 2 shows a crystal wafer oriented in the <111> direction.

According to a more specific feature of the invention, the marking of the <100> directions and thus the direction of the outer boundary of the individual components, is to be effected with a mechanical pressing method. It is very beneficial in this respect to use a square base diamond pyramid penetrator of the type used to measure Vickers hardness. Tears occur then at the edges of the rhombic impressed figure whose direction is parallel to <100>.

Another way is to determine the marking of the <100> directions by the X-ray method.

According to an embodiment example of the invention the substrate wafer is divided by the application of mechanical forces, along the scored lines. It is preferable to produce the necessary pressure with a roller of hard material, particularly a steel roller.

The spinel substrate wafer may also be divided according to a thermal separating method, for example, by taping the separating lines with a heated wedge or with a heated tip. Another possible mode of effecting the separation into

I claim:

1. A process for separating semiconductor devices which comprises providing a Mg-Al spinel substrate, epitaxially growing a semiconductor layer on one surface of said substrate, forming a plurality of scored lines in said substrate prior to forming the devices in the semi-conductor layer, creating the devices in the semiconductor layer so that their bondaries are parallel to said lines, and then dividing the substrate and semiconductor layer along said scored lines into a plurality of individual devices.

2. The method of claim 1, wherein a (100) oriented surface of said pinel spinel wafer is used and the scored lines and boundary lines are parallel to the 100 directions of the substrate.

3. The method of claim 1, wherein the epitaxially grown layer is selected from silicon, germanium, an $A^{III}B^{V}$ compound and silicon carbide.

* * * * *